United States Patent
Yeh et al.

(10) Patent No.: US 11,488,949 B1
(45) Date of Patent: Nov. 1, 2022

(54) METHOD OF GENERATING DUMMY PATTERNS FOR DEVICE-UNDER-TEST AND CALIBRATION KITS

(71) Applicant: UNITED MICROELECTRONICS CORP., Hsin-Chu (TW)

(72) Inventors: Kuo-Liang Yeh, Hsinchu (TW); Jinn-Horng Lai, Miaoli County (TW); Ching-Wen Hung, Tainan (TW); Chien-Tung Yue, Taipei (TW); Chun-Li Lin, Changhua County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/340,119

(22) Filed: Jun. 7, 2021

(51) Int. Cl.
  G06F 17/00 (2019.01)
  H01L 27/02 (2006.01)
  G01R 35/00 (2006.01)

(52) U.S. Cl.
  CPC ........ H01L 27/0207 (2013.01); *G01R 35/005* (2013.01)

(58) Field of Classification Search
  CPC .................. G01R 35/005; H01L 27/0207
  See application file for complete search history.

(56) References Cited

U.S. PATENT DOCUMENTS

| 9,425,112 B2 | 8/2016 | Chen | |
|---|---|---|---|
| 2006/0157898 A1* | 7/2006 | Colburn | G03F 7/0002 264/494 |
| 2013/0332092 A1* | 12/2013 | Chen | H01L 22/34 702/58 |

* cited by examiner

*Primary Examiner* — Alesa Allgood
(74) *Attorney, Agent, or Firm* — Winston Hsu

(57) ABSTRACT

The present invention provides a method of generating dummy patterns and calibration kits, including steps of generating devices-under-test (DUTs) using a point of said chip window layer as reference point in a unit cell, generating calibration kits corresponding to the DUTs using the point as reference point in corresponding unit cells, generating DUT dummy patterns for each DUTs individually in the unit cell, copying the DUT dummy patterns in the unit cell to the corresponding calibration kits in the corresponding unit cells using the point as reference point, and merging all of the unit cell and corresponding unit cells into a final chip layout.

8 Claims, 5 Drawing Sheets

METHOD OF GENERATING DUMMY PATTERNS FOR DEVICE-UNDER-TEST AND CALIBRATION KITS

BACKGROUND OF THE INVENTION

1. Field of the Invention

The present invention relates generally to a method of generating dummy patterns, and more specifically, to a method of generating dummy patterns for device-under-test (DUT) and calibration kits for radio frequency (RF) device layout enhancement.

2. Description of the Prior Art

Integrated circuits (ICs) formed on semiconductor substrates include multiple active and passive components, such as resistors, inductors, capacitors, transistors, amplifiers, etc. These components are fabricated according to a design specification that defines the ideal physical/electrical characteristics the component will exhibit (e.g., resistance, inductance, capacitance (RLC), gain, etc.). Though it is desirable to verify that each component fabricated complies with its specific design specification, typically, after integration into a circuit, an individual component cannot be readily tested. This problem is getting more serious in passive devices such as inductors, transformers, transmission lines, or the like commonly used in radio frequency (RF) applications. Due to the short wavelengths and high frequencies of RF signals, RF devices, which have relatively large sizes compared to the small wavelengths, have significant cross-talks with each other and with nearby conductive components. The performance of the RF devices is thus affected significantly by the nearby conductive features and devices.

Thus, "standalone" copies of the individual IC components, components fabricated with the same process and with the same physical/electrical characteristics as the IC components, are fabricated on the wafer, and it is assumed that the physical/electrical properties measured for the "standalone" copies represent those of the non-tested individual IC components. During the testing of high frequency RF devices, the "standalone" copy, referred to as the "device-under-test (DUT)", is electrically connected to leads and test pads, which are further connected to external testing equipment. Though the measured physical/electrical properties should accurately represent those of the DUT (and the individual IC component represented), the test pads and leads contribute physical/electrical characteristics, known as "parasitics" (e.g., resistance, capacitance, and inductance from the test pads and leads), that contribute to the measured characteristics of the DUT. The parasitics should be factored out or extracted by a process known as "de-embedding" to reveal the intrinsic characteristics of the DUT.

Thus, accurate de-embedding methods are required to eliminate the parasitic contributions and to accurately describe the intrinsic characteristics of the DUT (and ultimately, the individual IC component represented). Currently, one method for de-embedding parasitics involves, for example, analyzing four different DUTs that are fabricated with the same process and in accordance with the same design specifications as the IC devices of interest. These four DUTs are widely known to those skilled in the art as "short," "load," "open," and "thru" DUTs (referred hereinafter as calibration kits), to account for parasitics such as resistance, inductance, and capacitance arising from the test pads and leads at high frequencies (up to the GHz level).

Nevertheless, in the manufacture of semiconductor devices nowadays, dummy patterns (ex. conductive polysilicon patterns or metal patterns) are always generated in layout to mitigate the loading effect that may occur in photolithography process, etching process or planarization process. These dummy patterns would also induce parasitic RLC. In current approach, the dummy patterns generated based on DUTs and generated based on their corresponding calibration kits are not consistent. This inconsistency would result in not exactly the same parasitic RLC characteristics between the DUTs and the corresponding calibration kits, which may further cause the measured RF characteristics after de-embedding process false and unreliable for later SPICE model generation.

SUMMARY OF THE INVENTION

In the light of the conventional problem that the parasitic RLC characteristics between DUTs and corresponding calibration kits are not consistent, the present invention hereby provides a novel method of generating dummy patterns and calibration kits, featuring the generation of identical dummy patterns for DUTs and corresponding calibration kits before they are merged into a final chip.

The objective of the present invention is to provide a method of generating dummy patterns and calibration kits, including steps of generating devices-under-test (DUTs) on a chip window layer using a point of the chip window layer as reference point, wherein the DUTs are aligned in a unit cell, generating calibration kits corresponding to the DUTs on the chip window layer using the point as reference point, wherein the calibration kits are aligned in corresponding unit cells, generating DUT dummy patterns on the chip window layer for each DUTs individually in the unit cell, copying the DUT dummy patterns in the unit cell to corresponding calibration kits in the corresponding unit cells on the chip window layer using the point as reference point, and merging all of the unit cell and the corresponding unit cells into a final chip layout.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
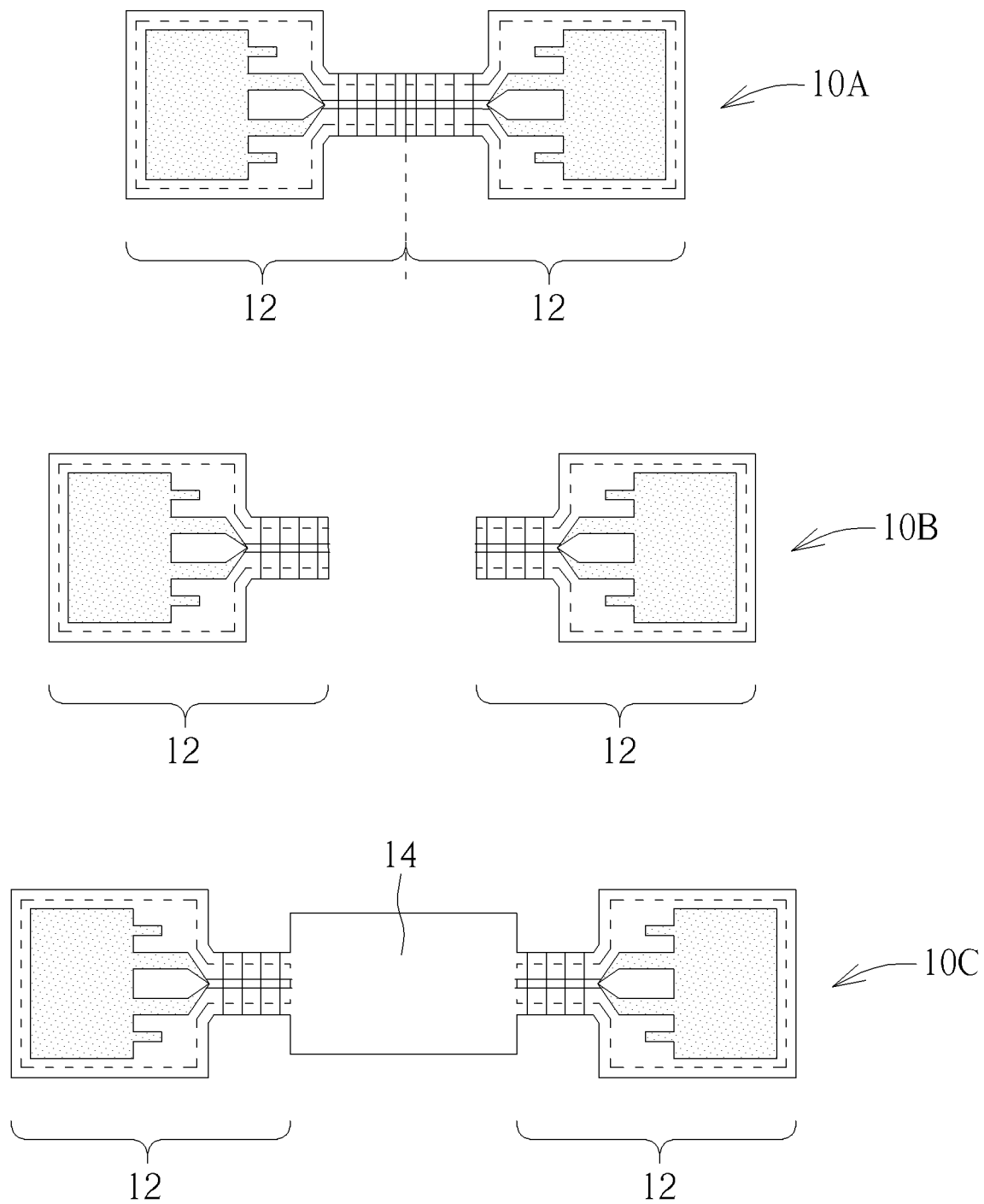
FIG. 1 is a top view of three exemplary calibration kits used in the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Referring now to the drawings, wherein like reference numbers are used herein to designate like elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

One of the obstacles in CMOS RF integrated circuit design is the availability of high-quality models for active and passive components at gigahertz (GHz) frequencies. A well-characterized RF active and passive components model library is desired to provide a successful RF IC design, to reduce cost, and to reduce time to market. RF components are often characterized by using a vector network analyzer (VNA), which measures vector ratios of reflected and transmitted energy to energy incident upon the device-under-test (DUT). One of the main interests in RF probing for device characterization purposes is characterizing an intrinsic device for modeling its behavior at GHz frequencies when embedded in an IC design environment, for example. When using a DUT for testing such characteristics, the probe pad parasitic effects should be de-embedded from the measurements because the measurements on the wafer with calibrated probe tips includes the intrinsic device characteristics plus the pad parasitics.

FIG. 1 illustrates the top views of exemplary calibration kits used in the present invention. Each of calibration kits may adopt a structure that is adapted for the commonly known open-short de-embedding methods, three-step de-embedding methods (including de-embedding using a short device, an open device, and a through device), or the like. For example, referring to FIG. 1, the illustrated exemplary calibration kit 10 includes short device 10A (wherein probe pads 12 and the respective leads are shorted), open device 10B (wherein test pads 12 and the respective leads are open (disconnected)), and through device 10C (wherein a passive device 14 is connected between probe pads 12 as a DUT).

The calibration kits 10A-10C may be formed in a calibration chip that is free from active devices such as transistors or may be formed in a production chip with actual circuit like CMOS devices. The passive devices 14 included in the calibration kit 10C may be inductors, transformers, baluns, transmission lines such as micro-stripes or co-planar waveguides, or even a radio frequency integrated circuit (RFIC) device. Interconnect structures, including a plurality of metal layers (ex. M1 to Mtop), may be provided below the calibration kits 10A-10C in dielectric layers such as low-k dielectric layers, with vias connected therebetween to provide electrical connections. Generally, the probe pads 12 of calibration kits 10A-10C are designedly formed on post-passivation interconnects (PPIs) and under-bump metallurgies (UBMs) above the top metal layer, and electrical connectors like solder bumps or copper pillars may be optionally formed on the probe pads 12. The aforementioned interconnect structures, PPIs and/or UBMs may be parts of the passive devices 14 of calibration kit 10C, which may be formed in a desirable shape (ex. coiled) in accordance with the type of the respective passive devices 14. Since the structure of calibration kit is conventional to those of skilled in the art and is not the key point of present invention. Those aforementioned detailed components in the calibration kit or relevant thereto will not be shown in the figures in case of obscuring the subject of present invention.

Figure 2:
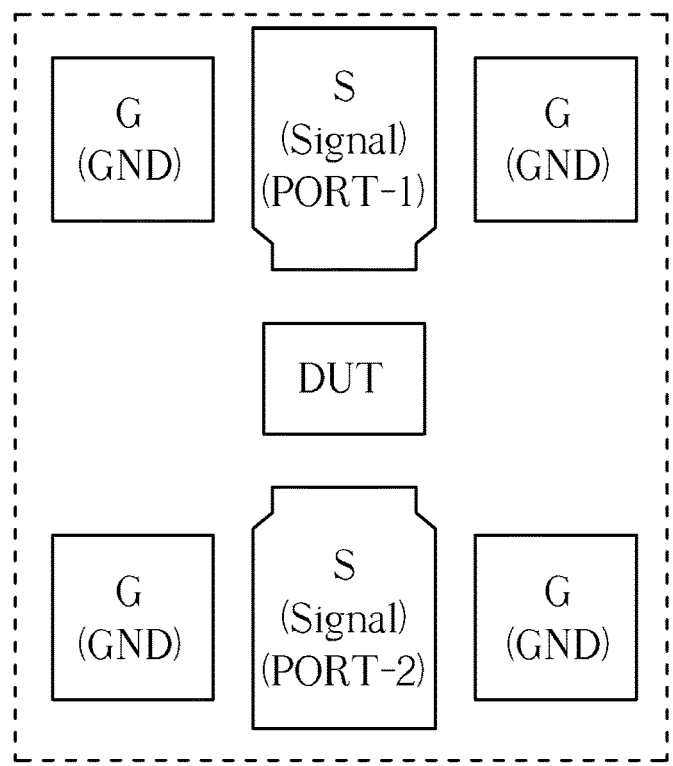
FIG. 2 is a ground-signal-ground (GSG) testing layout configuration for the calibration kits.

In real implementation, the calibration kits of "short," "open," and "thru" DUTs as shown in FIG. 1 are usually arranged in a ground-signal-ground (GSG) testing layout configuration. As shown in FIG. 2, the ground pads (G) in the GSG configuration are proximate at two sides to the signal pads (S) in the middle to provide an electrical ground reference point for the DUT. In the "thru" DUTs calibration kit, the signal pads (S), like the probe pad 12 in FIG. 1, are electrically coupled to a DUT set in the center of pad area through leads or transmission lines to establish the electrical connections between the DUT and external devices, such as a testing device. Two signal pads (S) in the middle may be the port-1 and port-2 of RF device respectively. In "open" DUTs calibration kit, the DUT in the center will be removed from the GSG plane to form an open-circuit, while in "short" DUTs calibration kit, leads or transmission lines will connect directly between two signal pads (S) to form a short-circuit.

In the design, test and manufacture of semiconductor IC devices, shuttle program is widely adopted to share mask and microelectronics wafer fabrication cost between several designs or projects. With multi-project chip (MPC) or multi-project wafer (MPW) arrangement, one chip may be a combination of several designs from different clients, and this combined chip is then repeated all over the wafer during the manufacturing. MPC arrangement produces typically roughly equal number of chip designs per testing wafer. The IC Shuttle Program not only shares the cost of the mask among different designs or clients, but also completes chip trial production and verification, strengthening a client's cost advantage and operation efficiency.

The procedure for designing and producing a DUT board or wafer for testing new IC designs starts with the design spec—the document that addresses most of the electrical and mechanical design considerations defined in a design template. The information in the design spec is used to generate the DUT board layout, including DUT patterns, calibration kit patterns, dummy patterns and other routing. After component placement is completed, the layout is generated automatically using electronic design automation (EDA). The DUT patterns and calibration kit patterns in the present invention may be generated through EDA layout tools, such as those provided by Cadence, Synopsys or Mentor Graphics, but not limited thereto.

Figure 3:
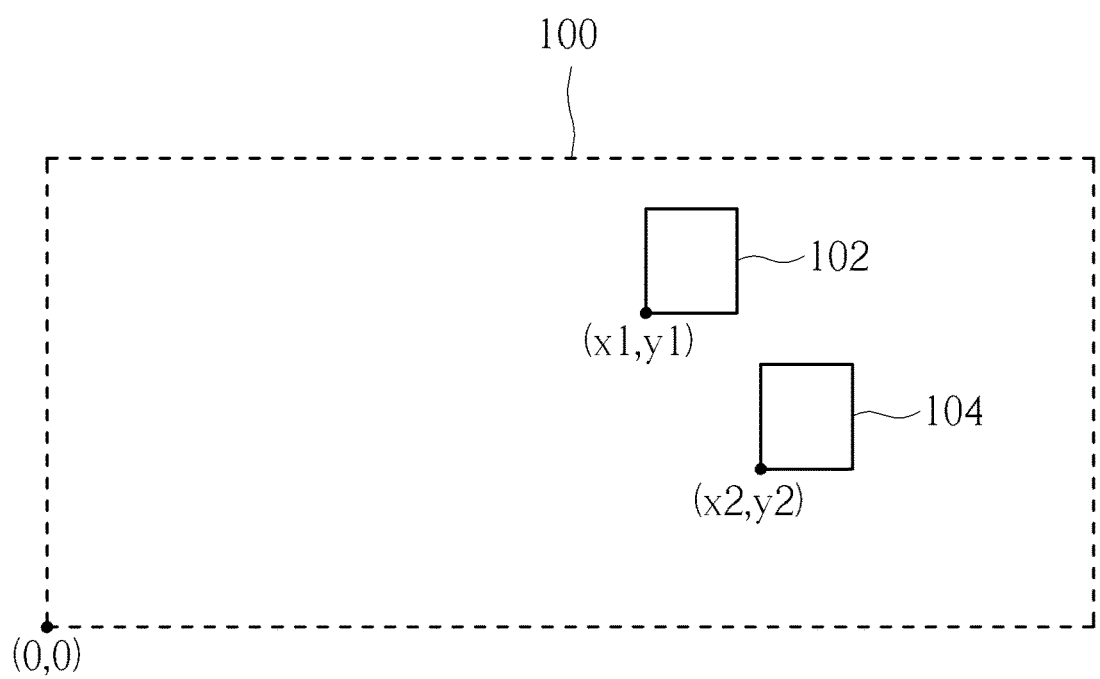
FIG. 3 is a schematic top view of a main product chip window layer in the generation of DUT patterns and calibration kit patterns.

Please refer to FIG. 3, which is a schematic top view of a chip window layer in the generation of DUT patterns and calibration kit patterns. A chip window layer 100 is the layout area in generating the necessary patterns for each main product, with a starting reference point, origin (0, 0) at its bottom-left corner. In the layout generation procedure, the DUT pattern will be first generated in the chip window layer 100. The DUT pattern is limited in an area of DUT block 102, whose bottom-left corner is at a position (x1, y1) with respect to the reference point (0, 0) of chip window layer 100. In order to measure the parasitic RLC characteristics required in the accurate de-embedding for eliminating the parasitic contributions, a calibration kit pattern such as aforementioned "short," "open," or "thru" DUTs corresponding to the generated DUT pattern would also be generated on the same basis of chip window layer 100. Similarly, the generated calibration kit pattern will be limited in an area of calibration kit block 104, whose bottom-left corner is at a position (x2, y2) with respect to the reference point (0, 0) of chip window layer 100.

Although the calibration kit pattern is generated according to its corresponding DUT pattern, in most situations, their block positions will be slightly different and offset from the DUT block. For example, as shown in FIG. 3, the position (x1, y1) of DUT block 102 is not identical to the position (x2, y2) of calibration kit block 104. This difference is resulted from different patterns and arrangements between the pure DUT and its corresponding calibration kits.

In conventional approach, multiple generated DUT patterns and multiple generated calibration kit patterns will first be merged and arranged into a final chip layout, and dummy patterns will then be filled into the layout for every arranged DUT block and calibration kit block. However, since the positions of generated DUT blocks 102 and calibration kit blocks 104 are not identical with respect to the reference point (0, 0) of chip window layer 101, the dummy patterns generated for their DUT patterns 102 and calibration kit patterns 104 would be inconsistent.

Figure 4:
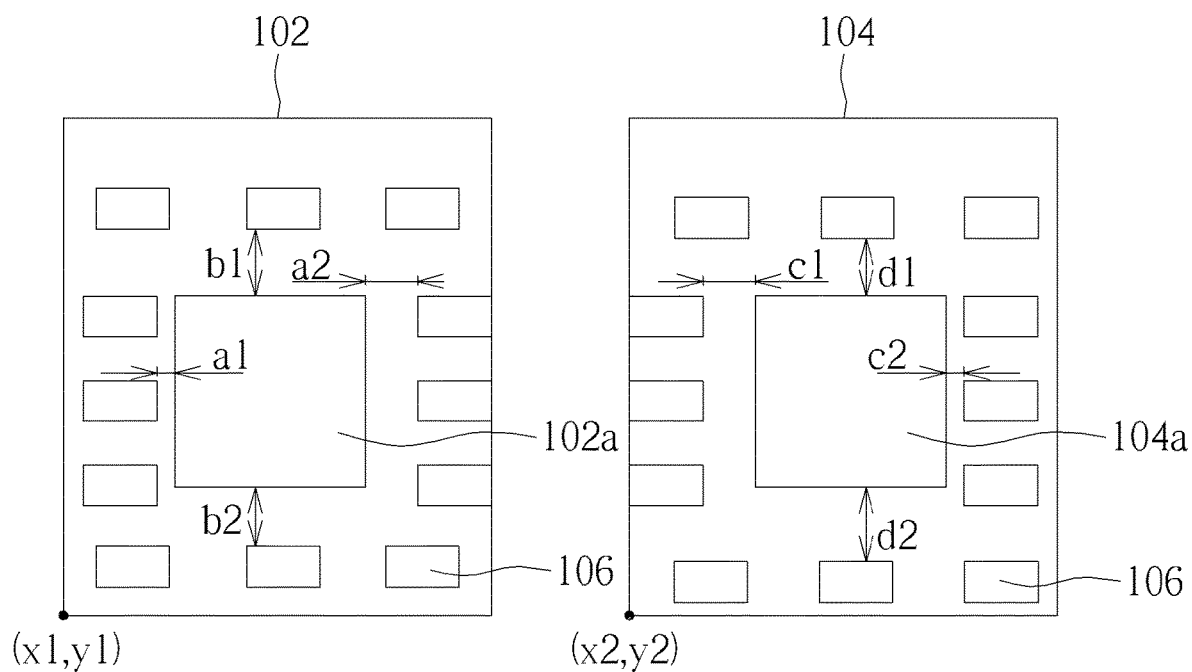
FIG. 4 is a schematic top view including a DUT block and a corresponding calibration kit block on the same basis of chip window layer

For example, please refer to FIG. 4, which is a schematic top view including a DUT block 102 and a corresponding calibration kit block 104 on the same basis of chip window layer. The DUT pattern 102a is located in the DUT block 102, with dummy patterns 106 formed surrounding and spaced-apart from the DUT pattern 102a. Similarly, the corresponding calibration kit pattern 104a is located in the calibration kit block 104, with dummy patterns 106 formed surrounding and spaced-apart from the calibration kit pattern 104a. Since the position (x1, y1) of defined DUT block 102 is inconsistent with the position (x2, y2) of defined calibration kit block 104 on the same chip window layer, the dummy patterns 106 generated respectively for the DUT pattern 102a and for the calibration kit pattern 104a on this basis would also be inconsistent. Regarding the application of high-frequency RF devices, the spacing between conductive patterns is essential to the parasitic RCL characteristics of the devices. In FIG. 4, the spacings a1, a2, b1 and b2 between the conductive DUT pattern 102a and the conductive dummy patterns 106 would not be consistent with corresponding spacings c1, c2, d1 and d2 between the calibration kit pattern 104a and the dummy patterns 106. This inconsistency would result in not exactly the same parasitic RLC characteristics between the DUTs and the corresponding calibration kits in the test, which may further cause the measured RF characteristics after de-embedding process false and unreliable for SPICE model generation in later procedure.

Figure 5:
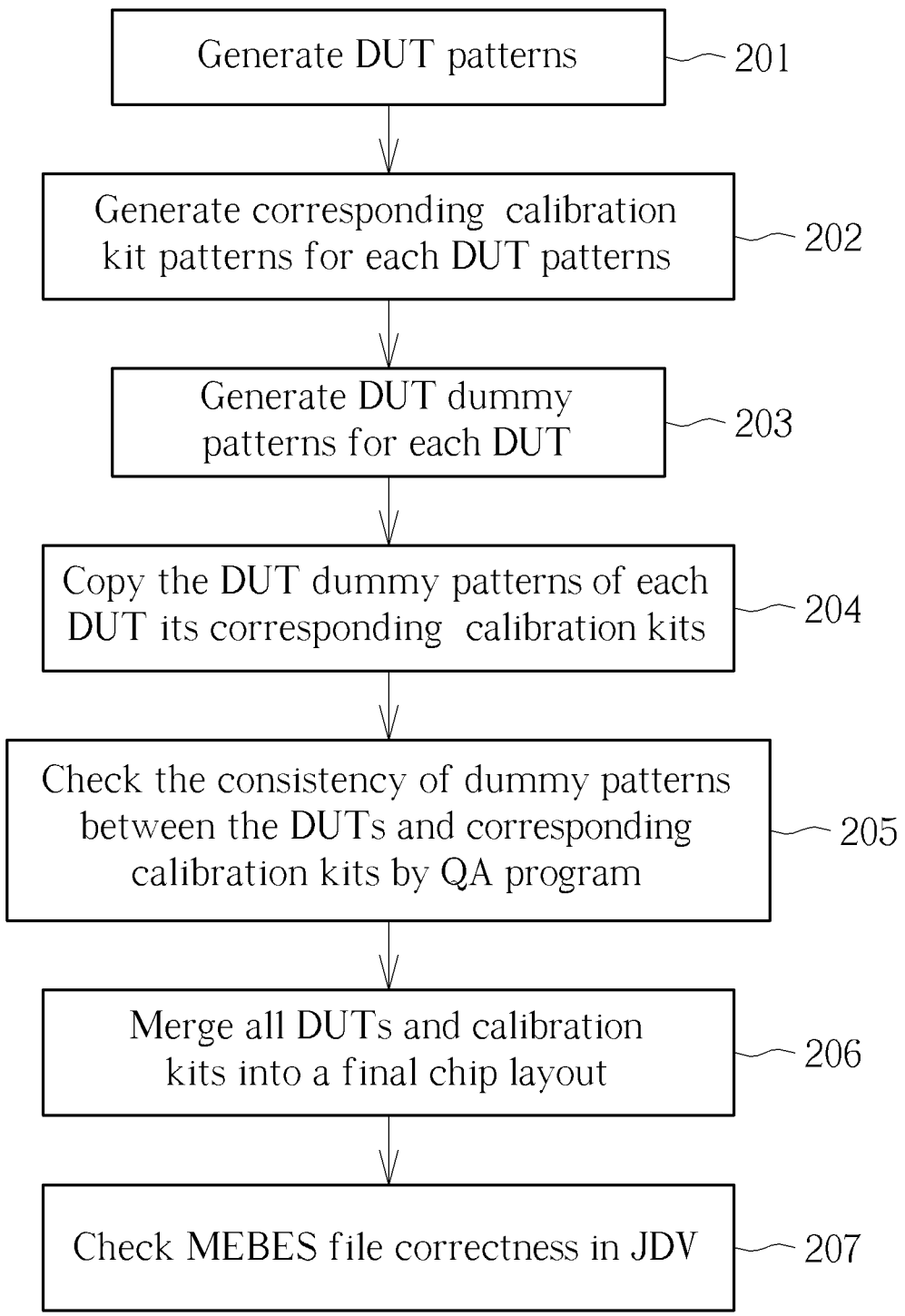
FIG. 5 is a process flow of generating dummy patterns for the DUT pattern and the calibration patterns in accordance with the embodiment of present invention.

In order to solve the aforementioned inconsistent dummy patterns generated for the DUT pattern and the calibration patterns, the present invention provides a novel method for generating dummy patterns. Please refer to FIG. 5, which is a process flow of generating dummy patterns for the DUT pattern and the calibration patterns in accordance with the embodiment of present invention. Firstly, in step 201, DUT patterns are generated in a chip window layer by EDA tools. This step is generally the same as the one in prior art. As shown in FIG. 3, the chip window layer 100 is a layout area for each main product or final chip, with a starting reference point, origin (0, 0), at its bottom-left corner. The reference point (0, 0) is preferably the bottom-left corner of a GSG PAD window as shown in FIG. 2. The DUT pattern is generated in the chip window layer 100 for each main product, with the bottom-left corner of its DUT block 102 defined and located at a position (x1, y1) with respect to the reference point (0, 0) of chip window layer 100.

Next, in step 202, the calibration kit patterns such as aforementioned "short," "open," or "thru" DUTs corresponding to each DUT pattern are generated on the same basis of chip window layer 100. Similarly, as shown in FIG. 3, the calibration kit pattern is generated in the chip window layer 100 for each main product, with the bottom-left corner of its calibration kit block 104 defined and located at a position (x2, y2) with respect to the reference point (0, 0) of chip window layer 100. The position (x1, y1) of DUT block 102 may not be identical to the position (x2, y2) of calibration kit block 104 in most situations. This difference is resulted from different patterns and arrangements between the pure DUT and its corresponding calibration kits.

After the calibration kit patterns of each DUT are generated, in step 203, dummy patterns are generated individually for each DUT in the chip window layer 100 using the point (0, 0) as a reference point. Different from the approach in prior art, the dummy patterns generated in this step is on the basis of each DUT pattern, rather than on the basis of final chip patterns (i.e. main product) merged by the DUT patterns and their corresponding calibration kit patterns.

After the DUT dummy patterns are generated for each DUT, in step 204, the DUT dummy patterns are copied to corresponding calibration kit as the calibration kit dummy patterns in the chip window layer 100 using the point (0, 0) as a reference point. Please note that the chip window layer and the origin (0, 0) in the chip window layer using in the DUT pattern (and dummy pattern) generation and the calibration kit pattern (and dummy pattern) generation are the same. In prior art, the dummy patterns for DUT and calibration kits are always generated after the DUT patterns and the calibration kit patterns are merged into a final chip layout. As mentioned above, the DUT dummy patterns and the calibration kit dummy patterns generated in this way will be inconsistent due to their different block positions. Through the complete copying of dummy patterns from DUT to corresponding calibration kit on the same reference basis in the present invention, the generated calibration kit dummy patterns will be identical to corresponding DUT dummy patterns since calibration kit dummy patterns are copied directly and entirely from its corresponding DUT on the same reference basis.

After the calibration kit dummy patterns are generated for each calibration kit, in step 205, use a common QA (quality assurance) program in layout tools to check the consistency of generated DUT dummy patterns and calibration kit dummy patterns. If the DUT dummy patterns and calibration kit dummy patterns are not identical, the process will be back to the step of generating dummy patterns, and the dummy patterns or generation rule for the dummy patterns may be modified until the final dummy patterns are consistent between DUTs and calibration kits.

After passing the consistency checking, in step 206, all of the generated DUT patterns (including their dummy pattern) and generated calibration kit patterns (including their dummy pattern) may be merged and arranged into a final chip layout. In this step, the DUTs and corresponding calibration kits are first merged into unit cells. The configuration of unit cells may reduce the performance gap resulted from positions and local variations, and it is more convenient and friendly for later RF measurement calibration. The aforementioned QA program may be used again to check the consistency for each unit cell.

Figure 6:
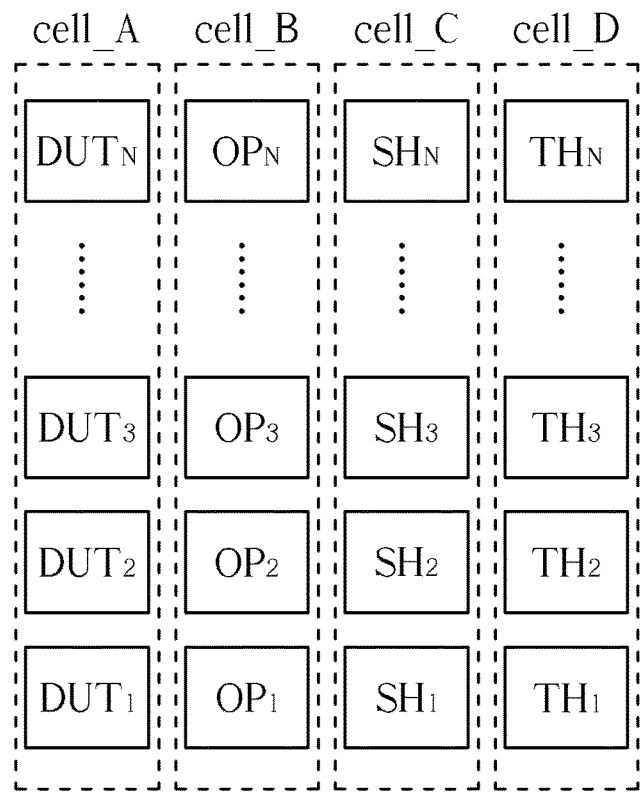
FIG. 6 is a schematic view of unit cell arrangement in vertical in accordance with the embodiment of present invention.

After the DUTs and corresponding calibration kits are merged into unit cells, the unit cells will be further merged into the final main product for tape-out. In the embodiment of present invention, two architectures for unit cell arrangement may be adopted. Please refer to FIG. 6, which is a schematic view of unit cell arrangement in vertical in accordance with the embodiment of present invention. As shown in the figure, in this embodiment, unit cell A is first merged by the DUT patterns $DUT_1 \sim DUT_N$ aligned vertically in a column, and their corresponding calibration kits, ex. $OP_1 \sim OP_N$, $SH_1 \sim SH_N$ and $TH_1 \sim TH_N$, may also be generated and aligned vertically in adjacent columns in their respective unit cells B, C and D. The patterns (ex $OP_1$, $SH_1$ and $TH_1$) of calibration kits in unit cells B~D will be aligned horizontally with their corresponding DUT patterns, i.e. $DUT_1$ in unit cell A. The unit cells A~D are generated individually without adding any OPC dummy patterns. The DUT patterns $DUT_1 \sim DUT_N$ may be same device with different dimensions.

Through the arrangement of unit cells for DUT and calibration kit, the generation of the calibration kits and their dummy patterns would be easier in the process. For example, in the embodiment of present invention, the DUT dummy patterns of $DUT_1 \sim DUT_N$ (i.e. unit cell A) may be first generated after the unit cells A~D are generated, and the generated DUT dummy patterns of $DUT_1 \sim DUT_N$ in the column of unit cell A may be copied entirely to their corresponding calibration kit $OP_1 \sim OP_N$, $SH_1 \sim SH_N$ and $TH_1 \sim TH_N$ in adjacent columns of unit cells B~D. This approach would be less complicated and time-saving in comparison to those conventional approaches, which the dummy patterns are copied one unit cell by one unit cell rather than column by column.

Figure 7:
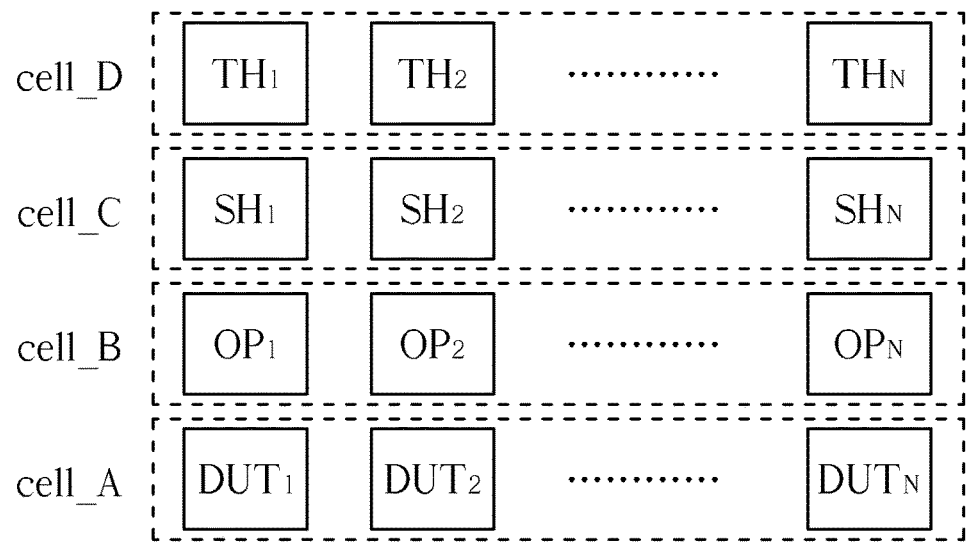
FIG. 7 is a schematic view of unit cell arrangement in horizontal in accordance with the embodiment of present invention.

Similarly, please refer to FIG. 7, which is a schematic view of unit cell arrangement in horizontal in accordance with another embodiment of present invention. As shown in the figure, in this embodiment, unit cell A is first merged by the DUT patterns $DUT_1 \sim DUT_N$ aligned horizontally in a row, and their corresponding calibration kits, ex. $OP_1 \sim OP_N$, $SH_1 \sim SH_N$ and $TH_1 \sim TH_N$, may also be generated and aligned horizontally in adjacent rows in their respective unit cells B, C and D. The patterns (ex $OP_1$, $SH_1$ and $TH_1$) of calibration kits in unit cells B~D will be aligned vertically with their corresponding DUT patterns, i.e. $DUT_1$ in unit cell A. The DUT dummy patterns of $DUT_1 \sim DUT_N$ (i.e. unit cell A) may be first generated after the unit cells A~D are generated, and the generated DUT dummy patterns of $DUT_1 \sim DUT_N$ in the row of unit cell A may be copied entirely to their corresponding calibration kits $OP_1 \sim OP_N$, $SH_1 \sim SH_N$ and $TH_1 \sim TH_N$ in adjacent rows of unit cells B~D.

Refer back to FIG. 5. After all DUTs and calibration kits having dummy patterns are merged into a final chip layout, in step 207, the empty spaces among the unit cells may be further filled with dummy patterns to provide more uniform pattern density, and the final GDS file of layout design may be generated and tape-out to the IC foundry or mask vendor for the final consistency checking. In this step, the data in a MEBES file may be reviewed in job deck view (JDV) to make sure the rule for post OPC (optical proximity correction), DRC (design rule checking) mask are obeyed and the final layout patterns is verified correct and consistent for release.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of generating dummy patterns and calibration kits, comprising:
   generating devices-under-test (DUTs) on a chip window layer using a point of said chip window layer as reference point, wherein said DUTs are aligned in a unit cell;
   generating calibration kits corresponding to said DUTs on said chip window layer using said point as reference point, wherein said calibration kits are aligned in corresponding unit cells;
   generating DUT dummy patterns on the chip window layer for each DUT individually in said unit cell;
   copying said DUT dummy patterns in said unit cell to corresponding said calibration kits in said corresponding unit cells on the chip window layer using said point as reference point; and
   merging all of said unit cell and said corresponding unit cells into a final chip layout.

2. The method of generating dummy patterns and calibration kits of claim 1, wherein said reference point is origin (0, 0) of a ground-source-ground (GSG) pad window.

3. The method of generating dummy patterns and calibration kits of claim 1, wherein generating said DUTs on said chip window layer further comprises:
   placing said DUTs horizontally in a row in said unit cell; and
   placing said calibration kits horizontally in adjacent rows in said corresponding unit cells.

4. The method of generating dummy patterns and calibration kits of claim 1, wherein generating said DUTs on said chip window layer further comprises:
   placing said DUTs vertically in a column in said unit cell; and
   placing said calibration kits vertically in adjacent columns in said corresponding unit cells.

5. The method of generating dummy patterns and calibration kits of claim 1, wherein merging all of said unit cell and said corresponding unit cells into a final chip layout further comprises generating other dummy patterns in empty spaces between said unit cells and said corresponding unit cells.

6. The method of generating dummy patterns and calibration kits of claim 1, wherein said calibration kit comprises "SHORT" DUT pattern, "OPEN" DUT pattern and "THROUGH" DUT pattern.

7. The method of generating dummy patterns and calibration kits of claim 1, further comprising checking a consistency between said DUT dummy patterns and said calibration kit dummy patterns.

8. The method of generating dummy patterns and calibration kits of claim 1, further comprising checking a correctness of MEBES file in job deck view (JDV).

* * * * *